(12) United States Patent
Teboulle et al.

(10) Patent No.: US 11,609,251 B2
(45) Date of Patent: Mar. 21, 2023

(54) ESTIMATION, DESPITE A FRAUD, OF THE POWER CONSUMED ON A PHASE

(71) Applicant: SAGEMCOM ENERGY & TELECOM SAS, Rueil Malmaison (FR)

(72) Inventors: Henri Teboulle, Rueil Malmaison (FR); Sébastien Noiret, Rueil Malmaison (FR)

(73) Assignee: SAGEMCOM ENERGY & TELECOM SAS, Rueil Malmaison (FR)

(*) Notice: Subject to any disclaimer, the term of this patent is extended or adjusted under 35 U.S.C. 154(b) by 0 days.

(21) Appl. No.: 17/851,680

(22) Filed: Jun. 28, 2022

(65) Prior Publication Data
US 2022/0413022 A1    Dec. 29, 2022

(30) Foreign Application Priority Data
Jun. 29, 2021 (FR) .................................... 2107011

(51) Int. Cl.
*G01R 21/133* (2006.01)
*G01R 11/40* (2006.01)

(52) U.S. Cl.
CPC ............ *G01R 21/133* (2013.01); *G01R 11/40* (2013.01)

(58) Field of Classification Search
CPC ............................. G01R 21/133; G01R 11/40

USPC .................................... 324/107, 76.11, 76.77
See application file for complete search history.

(56) References Cited

U.S. PATENT DOCUMENTS

| | | | |
|---|---|---|---|
| 6,236,197 B1 | 5/2001 | Holdsclaw et al. | |
| 2004/0150384 A1 | 8/2004 | Holle et al. | |
| 2008/0140326 A1* | 6/2008 | Scholtz .................. | G01R 25/00 702/60 |
| 2012/0046889 A1* | 2/2012 | Sun ......................... | H04L 12/66 702/61 |
| 2013/0211751 A1 | 8/2013 | Park et al. | |
| 2015/0229159 A1* | 8/2015 | Sonoda .................. | H02J 7/1484 320/137 |

FOREIGN PATENT DOCUMENTS

EP        0455518 A2    11/1991

* cited by examiner

*Primary Examiner* — Giovanni Astacio-Oquendo
(74) *Attorney, Agent, or Firm* — Muncy, Geissler, Olds & Lowe, P.C.

(57) ABSTRACT

A power estimation method is implemented in a three-phase electricity meter, and includes the steps of: detecting a fraud falsifying a first voltage measurement on a first phase; acquiring a second voltage measurement on a second phase, the second voltage measurement not being falsified by the fraud; estimating a first phase shift between the first phase voltage and a first phase current, by using a first phase shift estimation between the first phase voltage and the second phase voltage; estimating at least one first electrical power consumed on the first phase from a first current measurement on the first phase, of the second voltage measurement, and of the first phase shift.

16 Claims, 3 Drawing Sheets

ESTIMATION, DESPITE A FRAUD, OF THE POWER CONSUMED ON A PHASE

The invention relates to the field of three-phase electricity meters.

BACKGROUND OF THE INVENTION

Electricity meters, used in industrial applications, frequently measure powers and electrical energies which are distributed via very high current levels (up to 2000 A, typically). These meters are generally three-phase meters.

Such a meter comprises current inputs and voltage inputs.

Current sensors, for example Rogowski sensors or external current transformers, are conventionally mounted on the phases. Each current sensor is connected to a current input by two conductive wires. The meter thus acquires, for each phase, an image of the current circulating on said phase.

Each voltage input is conventionally connected to a phase by a conductive wire. The meter thus directly accesses the voltage present on each phase via the associated conductive wire.

A known fraud consists of cutting one or more of the conductive wires which connect the phases to the voltage inputs. The aim of such a fraud is to underevaluate the total energy consumed which is measured by the meter, so as to reduce the bill to be paid to the electricity energy distributor.

In case of fraud, the meters of the prior art continue to take metrological measurements as such on the three phases, without considering fraud, and therefore actually underevaluate the energy consumed. Even if fraud is detected, the distributor does not know the energy actually consumed by the installation of the fraudster. Yet, it can prove to be useful to know the energy actually consumed, for example to reclaim from the fraudster the payment of the energy not billed (in addition to possible penalties aiming to sanction the fraud attempt).

OBJECT OF THE INVENTION

The invention aims to estimate, despite a fraud consisting of falsifying voltage measurements on a phase, the total energy consumed by an installation.

SUMMARY OF THE INVENTION

In view of achieving this aim, a power estimation method is proposed, implemented in a three-phase electricity meter connected to three phases of a distribution network, and comprising the steps of:
  detecting a fraud falsifying at least one first voltage measurements, image of a first phase voltage present on a first phase;
  acquiring at least one second voltage measurement, image of a second phase voltage present on a second phase, the at least one second voltage measurement not being falsified by fraud;
  estimating a first phase shift between the first phase voltage and a first phase current circulating on the first phase, by using a first phase shift estimation which is a theoretical estimation of an expected phase shift without fraud between the first phase voltage and the second phase voltage;
  estimating at least one first electrical power consumed on the first phase from at least one first current measurement, image of the first phase current, of the at least one second voltage measurement, and of the first phase shift.

When a fraud is detected on the first phase, the first voltage measurements are falsified and are not therefore useable. The power estimation method according to the invention thus uses, in particular, the second voltage measurement on the second phase, as well as a theoretical estimation of the first phase shift between the first phase voltage and the first phase current, to estimate the first electrical powers. The energy distributor can therefore obtain, despite the fraud, a relatively precise estimation of the total electrical powers and of the total energy actually consumed by the installation.

In addition, a power estimation method is proposed, such as described above, in which the first phase shift is estimated from a phase shift between the second phase voltage and a second phase current circulating on the second phase, from a phase difference between the second phase current and the first phase current, and from the first phase shift estimation.

In addition, a power estimation method is proposed, such as described above, in which the first phase shift estimation is equal to +120° or to −120°. In addition, a power estimation method such as described above is proposed, in which the at least one second voltage measurement comprises an effective value of the second phase voltage and/or a level on a fundamental frequency of the second phase voltage.

In addition, a power estimation method such as described above is proposed, in which the at least one first electrical power comprises a first Active Power from the effective value of the second phase voltage, from an effective value of the first phase current, and from the first phase shift, and/or a first Reactive Power estimated from the level on the fundamental frequency of the second phase voltage, of a level on a fundamental frequency of the first phase current, and from the first phase shift, and/or a first Apparent Power estimated from the effective value of the second phase voltage and from the effective value of the first phase current.

In addition, a power estimation method such as described above is proposed, in which the fraud is detected when the at least one first voltage measurement is less than a predefined voltage threshold, while the at least one first current measurement is greater than a predefined current threshold.

In addition, a power estimation method such as described above is proposed, further comprising the steps, if the fraud also falsifies at least one third voltage measurement, image of a third phase voltage present on a third phase, of again using the at least one second voltage measurement to estimate at least one third electrical power consumed on the third phase.

In addition, a power estimation method such as described above is proposed, further comprising the steps of:
  acquiring at least one third voltage measurement, image of a third phase voltage present on a third phase, the third voltage measurement not being falsified by the fraud;
  calculating an arithmetic average of the at least one second voltage measurement and of the at least one third voltage measurement to estimate the at least one first electrical power.

In addition, a power estimation method such as described above is proposed, in which the first phase shift is obtained by calculating an arithmetic average of a phase shift obtained by using measurements on the second phase and a phase shift obtained by using measurements on the third phase.

In addition, a power estimation method such as described above is proposed, further comprising the steps of detecting if the distribution network comprises, or not, a neutral in addition to the three phases and, if this is not the case, of correcting at least one second electrical power consumed on the second phase, and, if the fraud does not falsify at least one third voltage measurement, image of a third phase voltage present on a third phase, of also correcting at least one third electrical power consumed on the third phase.

In addition, a power estimation method such as described above is proposed, in which the correction consists of multiplying the at least one second electrical power and the at least one third electrical power by one same predetermined factor, and of phase shifting the at least one second electrical power of a predefined second phase shift, and the at least one third electrical power of a predefined third phase shift.

In addition, a power estimation method such as described above is proposed, in which the predetermined factor is equal to $$\frac{2}{\sqrt{3}},$$

and in which the predefined second phase shift is equal to −30° and the predefined third phase shift is equal to +30°.

In addition, a power estimation method such as described above is proposed, in which an absence of a neutral is detected when an angle φ between the second phase voltage and the third phase voltage is such that:

$$180°-X° < |\varphi| < 180°+X°,$$

X being a positive predefined value and less than 30.

In addition, a three-phase electricity meter is proposed, comprising a processing component arranged to implement the power estimation method such as described above.

In addition, a three-phase electricity meter such as described above is proposed, further comprising a measuring component, separate from the processing component and arranged to produce the at least one first voltage measurement, the at least one second voltage measurement and the at least one first current measurement.

In addition, a computer program is proposed, comprising instructions which drive the processing component of the three-phase electricity meter such as described above to execute the steps of the power estimation method such as described above.

In addition, a recording media which can be read by a computer is proposed, on which the computer program is recorded, such as described above.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
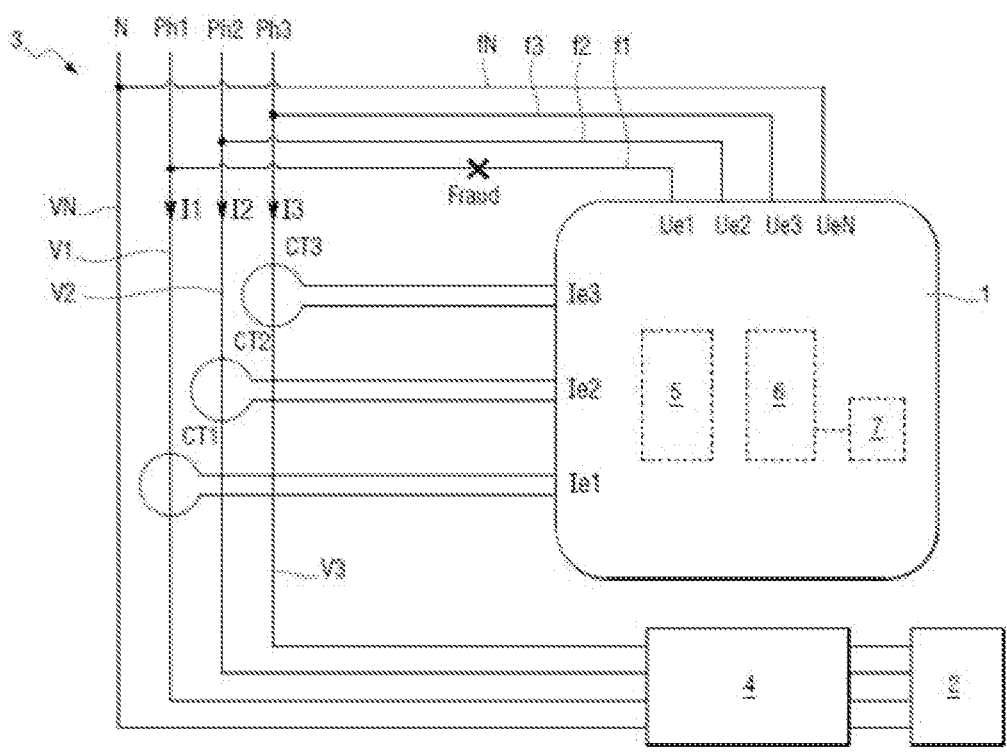
FIG. 1 represents a three-phase electricity meter according to the invention, in a four-wire configuration.

In reference to FIG. 1, the power estimation method according to a first embodiment of the invention is implemented in a three-phase electricity meter 1 which is intended to measure the electrical energy supplied to the installation 2 of a subscriber by a distribution network 3. This installation 2 is an industrial installation.

In this case, this is a four-wire configuration

The distribution network 3 therefore comprises a first phase Ph1, a second phase Ph2, a third phase Ph3 and a neutral N. A circuit breaker 4 is positioned "at the border" between the distribution network 3 and the installation 2. The three phases Ph1, Ph2, Ph3 and the neutral N enter into the circuit breaker 4 and emerge from it toward the installation 2. The circuit breaker 4 enables to cut the electrical energy distribution.

The meter 1 comprises four voltage inputs Ue1, Ue2, Ue3, UeN and three current phases Ie1, Ie2, Ie3 (each current input comprising two ports).

The voltage input Ue1 is connected to the first phase Ph1 by a conductive wire f1, the voltage input Ue2 is connected to the second phase Ph2 by a conductive wire f2, the voltage input Ue3 is connected to the third phase Ph3 by a conductive wire f3 and the voltage input UeN is connected to the neutral N by a conductive wire fN.

The current input Ie1 is connected to an external current transformer CT1 mounted on the first phase Ph1, the current input Ie2 is connected to an external current transformer CT2 mounted on the second phase Ph2, and the current input Ie3 is connected to an external current transformer CT3 mounted on the third phase Ph3. The external current transformers are located outside of the meter 1.

Each external current transformer has, in this case, a transformation ratio equal to 2000.

To achieve the metrological measurements, the meter 1 collects, at the current inputs Ie1, Ie2, Ie3, and thanks to the external transformers CT1, CT2 and CT3, an image of the phase currents I1, I2, I3 circulating on the phases Ph1, Ph2 and Ph3. The meter 1 also collects, on the voltage inputs Ue1, Ue2, Ue3 and UeN, the phase voltages V1, V2, V3 present on the phases Ph1, Ph2, Ph3 and the neutral voltage VN present on the neutral N.

The meter 1 comprises, in addition, a metrological core which is a "totally integrated" measuring component 5. The measuring component 5 comprises inputs connected to the current inputs Ie1, Ie2, Ie3 and to the voltage inputs Ue1, Ue2, Ue3, UeN, and integrates, in particular, input filters, analogue-to-digital converters, a digital calculation module, and a digital communication module for transmitting the digital measurements that it takes.

The measuring component 5 produces first voltage measurements, images of the first phase voltage V1 present on the first phase Ph1, and first current measurements, images of the first phase current I1 circulating on the first phase Ph1. In particular, the measuring component 5 produces the following measurements (after calculations):

$V1_{RMS}$, which is the effective value of the first phase voltage V1;

$VF1_{RMS}$, which is the level on the fundamental frequency of the first phase voltage V1;

$I1_{RMS}$, which is the effective value of the first phase current I1;

$IF1_{RMS}$, which is the level on the fundamental frequency of the first phase current I1.

Likewise, the measuring component 5 produces, for the second phase Ph2, second voltage measurements and second current measurements. In particular, the measuring component 5 produces the following measurements (after calculations):

$V2_{RMS}$, $VF2_{RMS}$, $I2_{RMS}$, $IF2_{RMS}$.

Likewise, the measuring component 5 produces, for the third phase Ph3, third voltage measurements and third current measurements. In particular, the measuring component 5 produces the following measurements (after calculations):

$V3_{RMS}$, $VF3_{RMS}$, $I3_{RMS}$, $IF3_{RMS}$.

The measuring component 5 also produces, for each phase, measurements of the phase shift between the phase voltage and the phase current on said phase. The measuring component 5 also produces measurements of phase difference between the two different phases and between the phase currents of two different phases.

In addition, the measuring component 5 calculates, from these measurements, and for each phase, the Active Power, the Reactive Power and the Apparent Power consumed on said phase. The measurements of energy consumed over time derive from these power estimations.

The meter 1 in addition comprises a processing component 6.

The processing component 6 is adapted to executing instructions of a program to implement the power estimation method according to the invention. The program is stored in a memory 7, which is integrated in or connected to the processing component 6. The processing component 6 is, for example, a conventional processor, a microcontroller, a DSP (Digital Signal Processor), or a programmable logic circuit such as an FPGA (Field Programmable Gate Array) or an ASIC (Application Specific Integrated Circuit).

In this case, the processing component 6 is a microcontroller.

The microcontroller 6 is connected to the measuring component 5 and acquires the measurements (as well as the calculation results and estimations) produced by the measuring component 5.

It is noted that the measuring component 5 operates as a "black box": the microcontroller 6 only has access to the data produced at the output by the measuring component 5 and not to the intermediate data processed in the measuring component 5. Moreover, the only measurements to which the microcontroller 6 has access are those produced by the measuring component 5.

At regular intervals, the microcontroller 6 attempts to detect the fraudulent cutting of one of the conductive wires f1, f2, f3. The microcontroller 6 detects a cutting of the conductive wire of a phase in the absence of voltage and in the presence of current on said phase.

For the first phase Ph1, for example, the microcontroller 6 acquires at least one first voltage measurement and at least one first current measurement produced by the measuring component 5, and detects a fraud when the at least one first voltage measurement is less than a predefined voltage threshold, while the at least one first current measurement is greater than a predefined current threshold.

The microcontroller 6 detects, in this case, a fraud on the first phase Ph1 when:

$V1_{RMS} < Vf$ and $I1_{RMS} > If$,

Vf being the predefined voltage threshold and If being the predefined current threshold.

Advantageously, If is chosen such that:

$Istart < If < Imin$,

Istart being the current value from which the meter 1 starts to measure the energy consumed, and Imin being the current value from which the meter 1 must measure the current with nominal precision.

In this case, the following occurs: Istart=1 mA and Imin=10 mA.

Therefore, for example, If=5 mA is chosen. For example, Vf=40V is chosen.

This fraud detection step is carried out in the same way for the two other phases.

It is now assumed that the microcontroller 6 has detected a fraud on the first phase Ph1 (only).

The first voltage measurements are therefore falsified by the fraud. The microcontroller 6 will therefore estimate at least one first electrical power consumed on the first phase Ph1 by using the voltage measurements on a reference phase which does not suffer fraud. This reference phase is, for example, the second phase Ph2. The microcontroller 6 therefore acquires at least one second voltage measurement, image of a second phase voltage V2 present on the second phase Ph2, the at least one second voltage measurement not being falsified by the fraud.

The microcontroller 6 acquires, in this case:

$V2_{RMS}$, $VF2_{RMS}$.

The microcontroller 6 must, in addition, estimate a first phase shift between the first phase voltage V1 and the first phase current I1 circulating on the first phase Ph1.

Yet, the phase shift information provided for the first phase Ph1 by the measuring component 5 is not valid, due to the fraud.

The microcontroller 6 will therefore estimate the first phase shift by using a first phase shift estimation, which is a theoretical estimation of an expected phase shift without the fraud (i.e. under normal conditions), between the first phase voltage V1 (the measurement of which is not usable in this case) and the (reference) second phase voltage.

The first phase shift estimation is, in this case, equal to +120°.

More specifically, the first phase shift is estimated from a phase shift between the second phase voltage V2 and the second phase current I2 circulating on the second phase Ph2, of a phase difference between the second phase current I2 and the first phase current I1, and of the first phase shift estimation.

The first phase shift (estimated by the microcontroller 6) between the first phase voltage V1 and the first phase current I1 is called φ1.

Thus, the following occurs:

φ1=Phase of (V1)−Phase of (I1)

To obtain φ1, the microcontroller 6 calculates:

φ1=(Phase of V1−Phase of V2)+(Phase of V2−Phase of I2)+(Phase of I2−Phase of I1)

The microcontroller 6 assimilates:

(Phase of V1−Phase of V2)

to the first phase shift estimation, i.e. to +120°.

The value:

(Phase of V2−Phase of I2)

is measured by the measuring component 5 (and acquired by the microcontroller 6).

The value:

(Phase of *I*2−Phase of *I*1)

is measured by the measuring component 5 (and acquired by the microcontroller 6).

The first phase shift φ1 is therefore estimated particularly cleverly, without using the measurements on the first phase Ph1, but by using the non-falsified available measurements, as well as the first phase shift estimation.

The microcontroller 6 also acquires at least one first current measurement, image of the first phase current I1 circulating on the first phase Ph1 (the current measurement is not falsified, as the fraud only impacts the first voltage measurements).

The microcontroller 6 thus estimates at least one first electrical power consumed on the first phase Ph1 from at least one first current measurement, image of the first phase current I1, of the at least one second voltage measurement, and of the first phase shift.

The microcontroller 6 calculates, in this case, the first Active Power, the first Reactive Power and the first Apparent Power consumed on the first phase Ph1.

The first Active Power is estimated from the effective value of the second phase voltage V2, from an effective value of the first phase current I1, and from the first phase shift. The first Reactive Power is estimated from the level on the fundamental frequency of the second phase voltage V2, from the level on the fundamental frequency of the first phase current I1, and from the first phase shift. The first Apparent Power is estimated from the effective value of the second phase voltage V2 and from the effective value of the first phase current I1.

The microcontroller 6 therefore calculates:

$P_1 = V2_{RMS} \cdot I1_{RMS} \cdot \cos \varphi 1$ (first Active Power);

$Q_1 = VF2_{RMS} \cdot IF1_{RMS} \cdot \sin \varphi 1$ (first Reactive Power);

$S_1 = V2_{RMS} \cdot I1_{RMS}$ (first Apparent Power).

If the microcontroller 6 detects a fraud which falsifies at least one first voltage measurement, image of a first phase voltage V1 present on the first phase Ph1, and which also falsifies at least one third voltage measurement, image of a third phase voltage V3 present on the third phase Ph3, the microcontroller 6 again uses the second phase Ph2 as a reference phase, both for estimating the first electrical power(s) consumed on the first phase Ph1, and the third electrical power(s) consumed on the third phase Ph3.

The microcontroller 6 therefore calculates (as described above):

$P_1 = V2_{RMS} \cdot I1_{RMS} \cos \varphi 1$ (first Active Power);

$Q_1 = VF2_{RMS} \cdot IF1_{RMS} \sin \varphi 1$ (first Reactive Power);

$S_1 = V2_{RMS} \cdot I1_{RMS}$ (first Apparent Power).

The microcontroller 6 also estimates the third Active Power, the third Reactive Power and the third Apparent Power consumed on the third phase, by calculating:

$P_3 = V2_{RMS} \cdot I3_{RMS} \cdot \cos \varphi 3$ (third Active Power);

$Q_3 = VF2_{RMS} \cdot IF3_{RMS} \cdot \sin \varphi 1$ (third Reactive Power);

$S_3 = V2_{RMS} \cdot I3_{RMS}$ (third Apparent Power).

The third phase shift φ3 is such that:

φ3=Phase of (*V*3)−Phase of (*I*3)

To estimate the third phase shift φ3, the microcontroller 6 calculates:

φ3=(Phase of *V*3−Phase of *V*2)+(Phase of *V*2−Phase of *I*2)+(Phase of *I*2−Phase of *I*3)

The microcontroller 6 assimilates:

(Phase of *V*3−Phase of *V*2)

to a third phase shift estimation, in this case equal to −120°. The third phase shift estimation is a theoretical estimation of an expected phase shift without the fraud (i.e. under normal conditions) between the third phase voltage V3 (the measurement of which is not usable in this case) and the (reference) second phase voltage V2.

The value:

(Phase of *V*2−Phase of *I*2)

is measured by the measuring component 5.

The value:

(Phase of *I*2−Phase of *I*3)

is measured by the measuring component 5.

Figure 2:
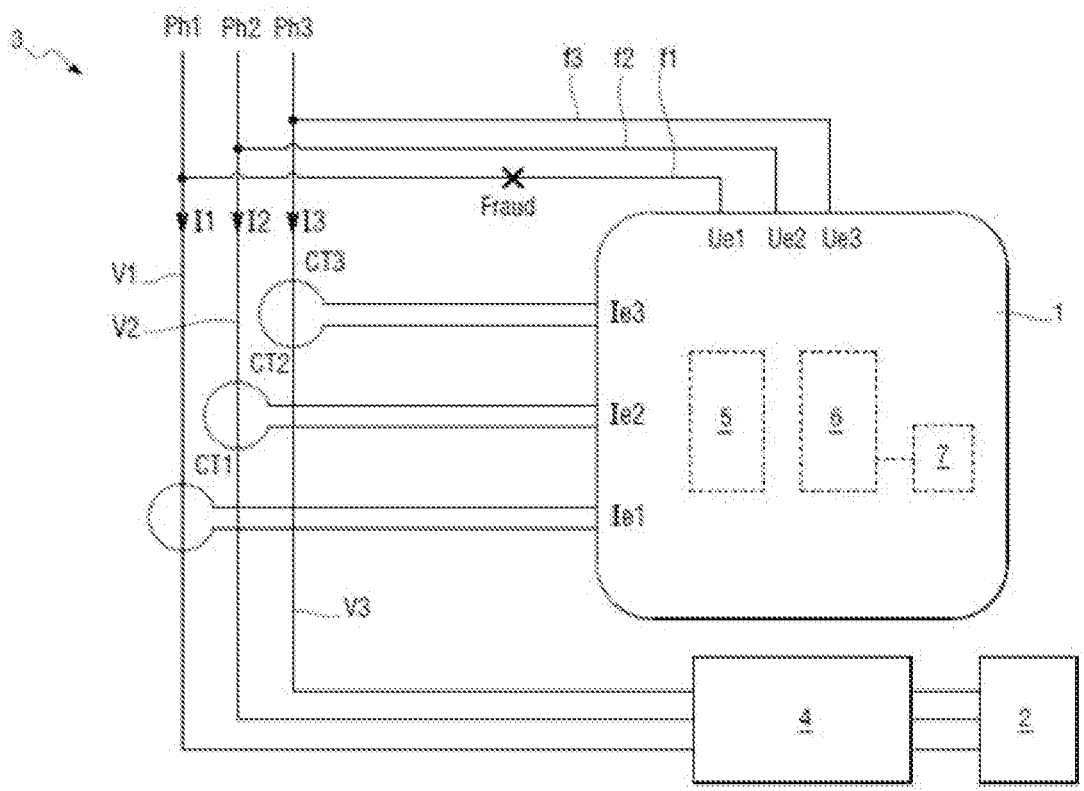
FIG. 2 represents a three-phase electricity meter according to the invention, in a three-wire configuration.

In reference to FIG. 2, this time a three-wire configuration is used.

The distribution network 3 comprises a first phase Ph1, a second phase Ph2 and a third phase Ph3, but no neutral.

The meter 1 comprises three voltage inputs Ue1, Ue2, Ue3 and three current inputs Ie1, Ie2, Ie3 (each current input comprising two ports).

The meter 1 again comprises a measuring component 5 and a microcontroller 6 connected to the measuring component 5.

Again, a situation is used where the conductive wire f1 has been cut by a malicious user.

Thus, the following occurs:

$V1_{RMS} < 40V$ and $I1_{RMS} > 5mA$.

The microcontroller 6 has therefore detected a fraud which falsifies at least one first voltage measurement, image of a first phase voltage V1 present on the first phase Ph1.

It is assumed that the microcontroller 6 has not detected fraud on the second phase Ph2, nor on the third phase Ph3. The second voltage measurements and the third voltage measurements are therefore not falsified by the fraud which affects the first phase Ph1.

The implementation of the invention is slightly different in the three-wire configuration. The reason for this difference is explained from the diagrams in FIGS. 3 and 4.

Figure 3:
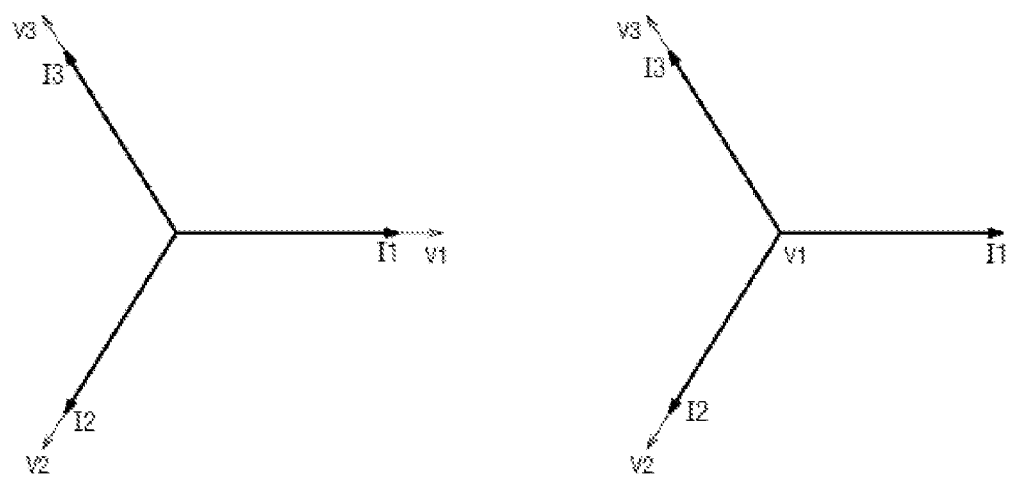
FIG. 3 represents, in the four-wire configuration, Fresnel diagrams of voltages and of currents measured on the phases in the normal case (on the left-hand side), and in case of fraud (on the right-hand side)

FIG. 3 represents, in the four-wire configuration in FIG. 1, the Fresnel diagram of voltages and currents in the normal case (on the left-hand side), and in case of fraud consisting of cutting the conductive wire f1 (on the right-hand side).

It is observed that the absence of a voltage measurement (V1 measurement in this case), has no impact on the amplitudes and the angles of the other voltages. In case of absence of two voltages, the same applies on the remaining voltage.

Figure 4:
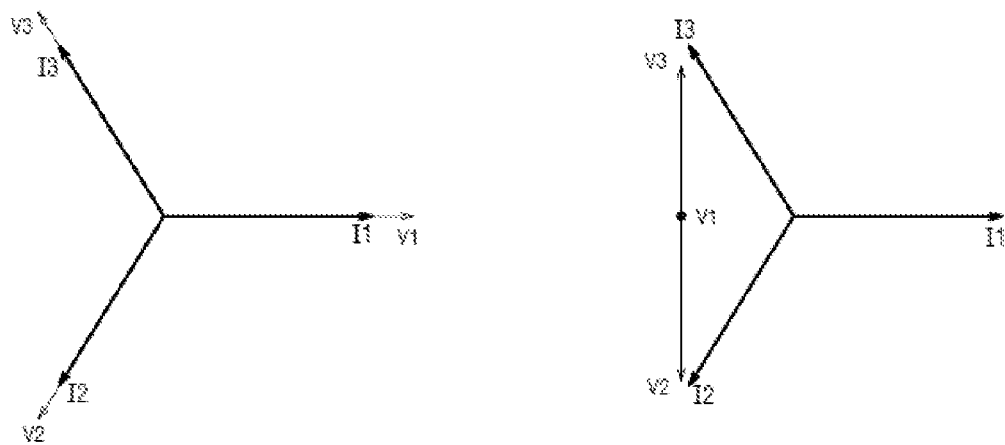
FIG. 4 is a figure similar to FIG. 3, but in a three-wire configuration.

FIG. 4 represents, in the three-wire configuration in FIG. 2, the Fresnel diagram of voltages and currents in the normal case (on the left-hand side) and in case of fraud consisting of cutting the conductive wire f1 (on the right-hand side).

It is observed that the absence of a voltage measurement (V1 measurement in this case) has an impact on the amplitudes measured (which are decreased by a ratio $$\cos(\pm 30°) = \frac{\sqrt{3}}{2}\Bigg),$$

but also on the angles measured of the other voltages (+30° on the V2 measurement and −30° on the V3 measurement).

The microcontroller 6 therefore first detects, preliminarily, if the distribution network 3 comprises or not a neutral in addition to the three phases.

If this is not the case, i.e. if the configuration is a three-wire configuration, the microcontroller 6 considers the factor $$\frac{\sqrt{3}}{2}$$

and phase shifts of +30° and −30° to estimate the electrical powers.

As has just been seen, the angle of the measurement of V2 has increased by 30°.

Consequently, in the three-wire configuration, the first phase shift estimation, equal to +120°, is no longer equal to:

(Phase of V1−Phase of V2), but to:

(Phase of V1−(Phase of V2−301)

Indeed, the phase difference of +120° corresponds to a phase difference between the first phase voltage V1 and the second phase voltage V2 when the measurement of the latter has not undergone the increase of +30° resulting from the absence of the measurement of the first phase voltage V1 (in the three-wire configuration).

The phase value Phase of V2−30° therefore corresponds to the phase value of a second virtual voltage measurement which would not have been phase shifted.

The microcontroller 6 therefore first calculates:

φ1=(Phase of V1−(Phase of V2−30°+(Phase of V2−Phase of I2)−30°+(Phase of I2−Phase of I1)

The value:

φ2=(Phase of V2−Phase of I2)

is measured by the measuring component 5.
The value:

(Phase of I2−Phase of I1)

is measured by the measuring component 5.
The microcontroller 6 then estimates the first electrical powers by the following formulas:

$$P_1 = \frac{2}{\sqrt{3}} \cdot V2_{RMS} \cdot I1_{RMS} \cdot \cos\varphi 1$$

(first Active Power);

$$Q_1 = \frac{2}{\sqrt{3}} \cdot VF2_{RMS} \cdot IF1_{RMS} \cdot \sin\varphi 1$$

(first Reactive Power);

$$S_1 = \frac{2}{\sqrt{3}} \cdot V2_{RMS} \cdot I1_{RMS}$$

(first Apparent Power).
The factor $$\frac{2}{\sqrt{3}}$$

enables to correct the impact of the fraud on the amplitudes, which has been stated above.

Advantageously, when the microcontroller 6 has detected that the distribution network 3 does not comprise a neutral in addition to the three phases (three-wire configuration), and if the fraud does not falsify the second voltage measurements, the microcontroller 6 also corrects at least one second electrical power consumed on the second phase Ph2. Likewise, if the fraud does not falsify the third voltage measurements, the microcontroller 6 also corrects at least one third electrical power consumed on the third phase Ph3.

The correction consists of multiplying the at least one second electrical power and the at least one third electrical power by one same predetermined factor (amplitude correction), and of phase shifting the at least one second electrical power of a predefined second phase shift, and the at least one third electrical power of a predefined third phase shift (phase correction).

The predetermined factor is equal to $$\frac{2}{\sqrt{3}}.$$

The predefined second phase shift is equal to −30° and the predefined third phase shift is equal to +30°.

The microcontroller 6 therefore calculates:

$$P_2 = \frac{2}{\sqrt{3}} \cdot V2_{RMS} \cdot I2_{RMS} \cdot \cos(\varphi 2 - 30°)$$

(second Active Power);

$$Q_2 = \frac{2}{\sqrt{3}} \cdot VF2_{RMS} \cdot IF2_{RMS} \cdot \sin(\varphi 2 - 30°)$$

(second Reactive Power);

$$S_2 = \frac{2}{\sqrt{3}} \cdot V2_{RMS} \cdot I2_{RMS}$$

(second Apparent Power);

$$P_3 = \frac{2}{\sqrt{3}} \cdot V3_{RMS} \cdot I3_{RMS} \cdot \cos(\varphi 3 + 30°)$$

(third Active Power);

$$Q_3 = \frac{2}{\sqrt{3}} \cdot VF3_{RMS} \cdot IF3_{RMS} \cdot \sin(\varphi_3 + 30°)$$

(third Reactive Power);

$$S_3 = \frac{2}{\sqrt{3}} \cdot V3_{RMS} \cdot I3_{RMS}$$

(third Apparent Power).

The value:

φ3=(Phase of V3–Phase of I3)

is measured by the measuring component 5.

As can be seen, the microcontroller 6 must detect if the configuration is a four-wire or a three-wire configuration, i.e. if the distribution network 3 comprises, or not, a neutral in addition to the three phases. The estimation of the first electrical powers indeed differs according to the actual configuration. Likewise, the application of the correction on the second electrical powers and on the third electrical powers depends on the configuration.

The power estimation method therefore comprises a preliminary step consisting of detecting if the network 3 and the meter 1 are located in a four-wire or a three-wire configuration.

For this, after having detected a fraud on the first phase Ph1, the microcontroller 6 measures the angle φ between the two remaining voltages, i.e. between the second phase voltage V2 and the third phase voltage V3 (in the case where the second voltage measurements of phase V2 and the third voltage measurements of the third phase voltage V3 are not falsified).

The microcontroller 6 thus determines if the angle φ is in an absolute value close to 180° and, if this is the case, detects a three-wire configuration.

The microcontroller 6 verifies if the angle φ belongs, or not, to the predefined interval:

180°–X° < |φ| < 180°+X°.

X is a positive predefined value, and less than 30. For example, the following occurs: X=20.

If the angle φ belongs to the predefined interval, the microcontroller 6 considers that the angle φ is in an absolute value close to 180° and therefore detects a three-wire configuration. Otherwise, the microcontroller 6 detects a four-wire configuration.

It is noted that, in the three-wire configuration, it is possible to estimate the powers which would have been consumed in the absence of fraud, only if only one of the voltage inputs is missing (fraud on one single phase, as in 3 wires, if two phases are missing, the meter is no longer supplied), while in the four-wire configuration, it is possible to estimate them in the case of two missing voltage inputs.

It is also noted that it is possible that, in the case where the microcontroller 6 detects that two voltage inputs are missing (fraud on two phases), the microcontroller 6 systematically detects the four-wire configuration (since the meter 1 is supplied); the meter 1 thus implements the estimation method under the corresponding conditions. Indeed, the meters automatically switches off when the configuration is a three-wire configuration and that two voltages are missing.

In a variany, and whatever the configuration (four-wire or three-wire), in the case where the fraud only affects the first phase Ph1, it is possible, to estimate the first electrical powers, to acquire at least one second voltage measurement, image of a second phase voltage V2 present on the second phase Ph2, and at least one third voltage measurement, image of a third phase voltage V3 present on the third phase Ph3.

The microcontroller 6 thus calculates an arithmetic average of the at least one second voltage measurement and of the at least one third voltage measurement to estimate the at least one first electrical power.

In this case, the microcontroller 6 therefore calculates an arithmetic average of $V2_{RMS}$ and of $V3_{RMS}$ to estimate the first Active Power and the first Apparent Power, and of $VF2_{RMS}$ and of $VF3_{RMS}$ to estimate the first Reactive Power.

It is also possible to use a first "average" phase shift, obtained by calculating an arithmetic average of a first phase shift φ1 obtained by using measurements on the second phase Ph2, and of a first phase shift φ1 obtained by using measurements on the third phase Ph3.

Figure 5:
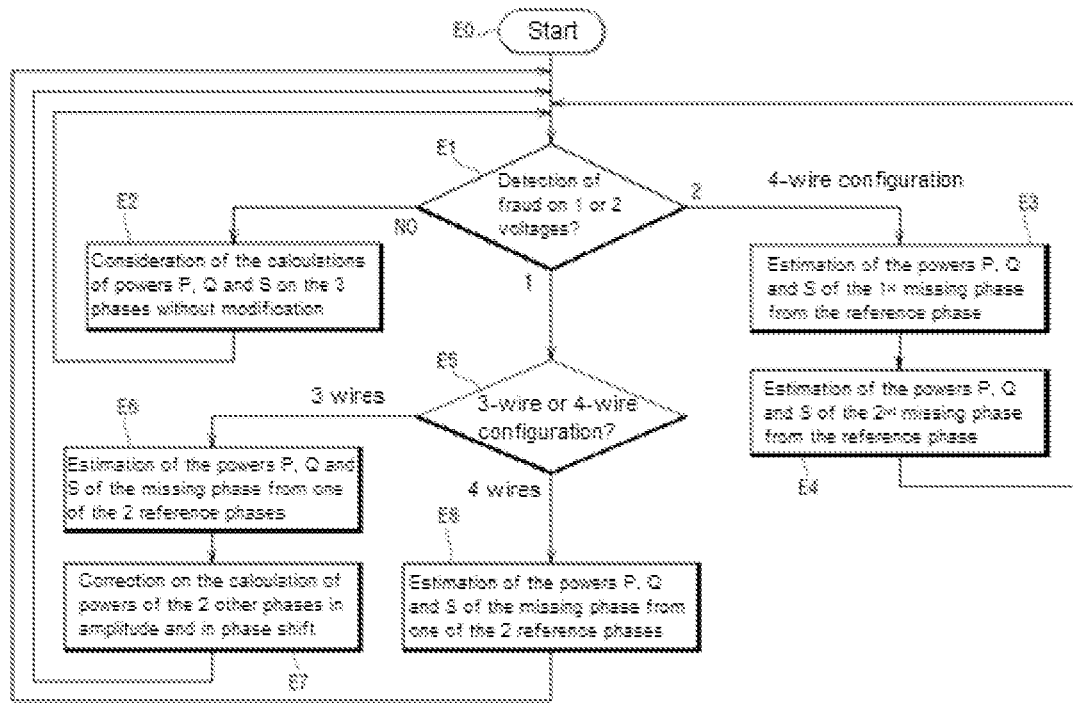
FIG. 5 is a flowchart representing the steps of the power estimation method according to the invention.

The different steps of the estimation method can be seen in FIG. 5.

The method starts at step E0.

The microcontroller 6 attempts to detect at least one fraud on one of the three phases (step E1).

If no fraud is detected, the microcontroller 6 acquires the estimations of the Active Power, of the Reactive Power and of the Apparent Power calculated by the measuring component 5 for the three phases, and does not correct these estimations (step E2). The acquisition of the powers is done at regular intervals (cycle of is, for example).

The method returns to step E1.

In step E1, if the microcontroller 6 detects a fraud on two phases, the microcontroller 6 directly deduces from it that the configuration is a four-wire configuration (see what has just been explained).

It is assumed, for example, that the first voltage measurements (of the first phase voltage V1) and the third voltage measurements (of the third phase voltage V3) are falsified.

The microcontroller 6 thus acquires the measurements produced by the measuring component 5.

The microcontroller 6 estimates, for the first phase Ph1, the first Active Power, the first Reactive Power and the first Apparent Power, from measurements on the second phase Ph2 (which are not falsified): step E3. The second phase Ph2 is the reference phase.

Then, the microcontroller 6 estimates, for the third phase Ph3, the third Active Power, the third Reactive Power and the third Apparent Power, from the same measurements on the second phase Ph2 (step E4).

For the second phase Ph2, the microcontroller 6 acquires the estimations of the second Active Power, of the second Reactive Power and the second Apparent Power which are calculated by the measuring component 5, and does not correct these estimations (as the configuration is a 4-wire configuration).

The acquisition of powers is done at regular intervals (cycle of 1s). The method returns to step E1.

It is now assumed that in step E1, the microcontroller 6 detects a fraud on one single phase; it is assumed that the first voltage measurements (first phase voltage V1) are falsified.

The microcontroller 6 thus detects if the network 3 and the meter 1 are located in a four-wire or a three-wire configuration (step E5).

If the three-wire configuration is detected, the microcontroller 6 acquires the measurements produced by the measuring component 5 and thus estimates, for the first phase Ph1, the first Active Power, the first Reactive Power and the first Apparent Power, from measurements on the second phase Ph2 (which are not falsified): step E6. The second phase Ph2 is the second reference phase. The microcontroller 6 would also have been able to use the measurements on the third phase Ph3.

In addition, the microcontroller 6 acquires the power estimations produced by the measuring component 5 for the second phase Ph2 and for the third phase Ph3, and thus makes a correction on these power estimations (amplitude correction and phase correction): step E7.

The acquisition of powers is done at regular intervals (cycle of is).

The method thus returns to step E1.

In step E5, if the four-wire configuration is detected, the microcontroller 6 acquires the measurements produced by the measuring component 5 and thus estimates, for the first phase Ph1, the first Active Power, the first Reactive Power and the first Apparent Power, from measurements on the second phase Ph2 (which are not falsified): step E8. The second phase Ph2 is the reference phase. The microcontroller 6 would also have been able to use the measurements on the third phase Ph3.

The microcontroller 6 acquires the power estimations produced by the measuring component for the second phase and for the third phase and does not make any correction.

The acquisition of powers is done at regular intervals (cycle of is).

The method thus returns to step E1.

Naturally, the invention is not limited to the embodiment described, but covers any variant coming within the ambit of the invention as defined by the claims.

It is indicated that the first phase shift estimation, enabling to estimate the phase difference between the first phase voltage and the second phase voltage, is equal to +120°. Naturally, this value depends on phases which are called "first phase" and "second phase"; the first phase shift estimation could be equal to −120°.

Likewise, the predefined second phase shift could be equal to +30° and the predefined third phase shift to −30°.

The invention claimed is:

1. A power estimation method, implemented in a three-phase electricity meter connected to three phases of a distribution network, and comprising the steps of:
   detecting a fraud falsifying at least one first voltage measurement, image of a first phase voltage present on a first phase;
   acquiring at least one second voltage measurement, image of a second phase voltage present on a second phase, the at least one second voltage measurement not being falsified by the fraud;
   estimating a first phase shift between the first phase voltage and a first phase current circulating on the first phase, by using a first phase shift estimation which is a theoretical estimation of an expected phase shift without the fraud between the first phase voltage and the second phase voltage;
   estimating at least one first electrical power consumed on the first phase from at least one first current measurement, image of the first phase current, from the at least one second voltage measurement, and from the first phase shift.

2. The power estimation method according to claim 1, wherein the first phase shift is estimated from a phase shift between the second phase voltage and a second phase current circulating on the second phase, of a phase difference between the second phase current and the first phase current, and of the first phase shift estimation.

3. The power estimation method according to claim 1, wherein the first phase shift estimation is equal to +120° or to −120°.

4. The power estimation method according to claim 1, wherein the at least one second voltage measurement comprises an effective value of the second phase voltage and/or a level on a fundamental frequency of the second phase voltage.

5. The power estimation method according to claim 4, wherein the at least one first electrical power comprises a first Active Power estimated from the effective value of the second phase voltage, from an effective value of the first phase current, and from the first phase shift, and/or a first Reactive Power estimated from the level on the fundamental frequency of the second phase voltage, from a level on a fundamental frequency of the first phase current, and from the first phase shift, and/or a first Apparent Power estimated from the effective value of the second phase voltage and from the effective value of the first phase current.

6. The power estimation method according to claim 1, wherein the fraud is detected when the at least one first voltage measurement is less than a predefined voltage threshold, while the at least one first current measurement is greater than a predefined current threshold.

7. The power estimation method according to claim 1, further comprising the steps, if the fraud also falsifies at least one third voltage measurement, image of a third phase voltage present on a third phase, of again using the at least one second voltage measurement to estimate at least one third electrical power consumed on the third phase.

8. The power estimation method according to claim 1, further comprising the steps of:
   acquiring at least one third voltage measurement, image of a third phase voltage present on a third phase, the third voltage measurement not being falsified by the fraud;
   calculating an arithmetic average of the at least one second voltage measurement and of the at least one third voltage measurement to estimate the at least one first electrical power.

9. The power estimation method according to claim 8, wherein the first phase shift is obtained by calculating an arithmetic average of a phase shift obtained by using measurements on the second phase and of a phase shift obtained by using measurements on the third phase.

10. The power estimation method according to claim 1, further comprising the steps of detecting if the distribution network comprises, or not, a neutral in addition to the three phases and, if this is not the case, of correcting at least one second electrical power consumed on the second phase, and, if the fraud does not falsify at least one third voltage measurement, image of a third phase voltage present on a third phase, of also correcting at least one third electrical power consumed on the third phase.

11. The power estimation method according to claim 10, wherein the correction consists of multiplying the at least one second electrical power and the at least one third electrical power by one same predetermined factor, and of phase shifting the at least one second electrical power of a predefined second phase shift, and the at least one third electrical power of a predefined third phase shift.

12. The power estimation method according to claim 11, wherein the predetermined factor is equal to $$\frac{2}{\sqrt{2}},$$

and wherein the predefined second phase shift is equal to −30° and the predefined third phase shift is equal to +30°.

13. The power estimation method according to claim 11, wherein an absence of neutral is detected when an angle φ between the second phase voltage and the third phase voltage is such that:

$$180°-X° < |\varphi| < 180°+X°,$$

X being a positive predefined value and less than 30.

14. A three-phase electricity meter, comprising a processing component arranged to implement the power estimation method according to claim 1.

15. The three-phase electricity meter according to claim 14, further comprising a measuring component, separate from the processing component and arranged to produce the at least one first voltage measurement, the at least one second voltage measurement and the at least one first current measurement.

16. A non-transitory recording medium which can be read by a computer, on which a computer program is recorded, the computer program comprising instructions which drive a processing component of a three-phase electricity meter to execute the steps of the power estimation method according to claim 1.

\* \* \* \* \*